(12) United States Patent
Liu et al.

(10) Patent No.: US 9,013,204 B2
(45) Date of Patent: Apr. 21, 2015

(54) TEST SYSTEM AND TEST METHOD FOR PCBA

(75) Inventors: Kuan-Lin Liu, New Taipei (TW); Kuo-Jung Peng, New Taipei (TW)

(73) Assignee: Wistron Corp., New Taipei (TW)

( * ) Notice: Subject to any disclaimer, the term of this patent is extended or adjusted under 35 U.S.C. 154(b) by 181 days.

(21) Appl. No.: 13/566,981

(22) Filed: Aug. 3, 2012

(65) Prior Publication Data
US 2013/0181737 A1 Jul. 18, 2013

(30) Foreign Application Priority Data

Jan. 13, 2012 (TW) .............................. 101101339 A

(51) Int. Cl.
*G01R 31/28* (2006.01)
*G01R 31/11* (2006.01)

(52) U.S. Cl.
CPC ............ *G01R 31/2812* (2013.01); *G01R 31/11* (2013.01)

(58) Field of Classification Search
USPC ............ 324/763.01, 757.02, 754.07, 754.08, 324/227, 750.15, 750.16, 762.01, 762.02, 324/555, 756.01, 756.07; 371/22.1, 22.6; 714/724, 734, 733, 742
See application file for complete search history.

(56) References Cited

U.S. PATENT DOCUMENTS

| | | | |
|---|---|---|---|
| 5,649,121 A * | 7/1997 | Budman et al. ............... | 710/301 |
| 6,178,526 B1 * | 1/2001 | Nguyen et al. ............... | 714/42 |
| 6,222,739 B1 * | 4/2001 | Bhakta et al. ............... | 361/790 |
| 6,704,897 B1 * | 3/2004 | Takagi ........................ | 714/739 |
| 7,206,703 B1 | 4/2007 | Papageorgiou et al. | |
| 7,372,287 B2 * | 5/2008 | Ezoe ........................ | 324/754.07 |
| 7,954,019 B2 | 5/2011 | Chen et al. | |
| 2006/0282722 A1 * | 12/2006 | Co et al. ..................... | 714/724 |
| 2009/0267628 A1 * | 10/2009 | Takase ....................... | 324/755 |
| 2013/0243167 A1 * | 9/2013 | Droohaag et al. ........ | 379/27.03 |

FOREIGN PATENT DOCUMENTS

| | | |
|---|---|---|
| TW | I234705 | 5/2008 |
| TW | M362410 U1 | 8/2009 |
| TW | 200949275 A1 | 12/2009 |

OTHER PUBLICATIONS

Taiwan Patent Office, Office Action, Patent Application Serial No. 101101339, Dec. 2, 2013, Taiwan.
China Patent Office, Office Action, Patent Application Serial No. 201210025657.4, Jan. 6, 2015, China.

* cited by examiner

*Primary Examiner* — Huy Q Phan
*Assistant Examiner* — Thang Le

(57) ABSTRACT

A test system is provided. A printed circuit board (PCB) includes a plurality of traces and at least one test point. A central processing unit (CPU) socket including a plurality of first pins and a memory module slot including a plurality of second pins are disposed on the PCB. Each of the second pins is coupled to the corresponding first pin of the CPU socket via the corresponding trace. A CPU interposer board is inserted into the CPU socket, and a memory interposer board is inserted into the memory module slot. The traces form a test loop via the CPU interposer board and the memory interposer board. When an automatic test equipment (ATE) provides a test signal to the test loop via the test point, the ATE determines whether the test loop is normal according to a reflectometry result of the test signal.

24 Claims, 6 Drawing Sheets

TEST SYSTEM AND TEST METHOD FOR PCBA

CROSS REFERENCE TO RELATED APPLICATIONS

This Application claims priority of Taiwan Patent Application No. 101101339, filed on Jan. 13, 2012, the entirety of which is incorporated by reference herein.

BACKGROUND OF THE INVENTION

1. Field of the Invention

The invention relates to a test system, and more particularly to a test system for a printed circuit board assembly (PCBA).

2. Description of the Related Art

In motherboard manufacturing processes, various components disposed on a motherboard need to be tested in advance, to avoid generating problems in production, thereby causing additional costs for manufacturers.

In general, when testing whether a slot or a connector of a motherboard is normal, e.g. whether solder is empty, or there is an open circuit, or short circuit or there are other abnormal states occurring between the slot and the motherboard, a memory module, an interface card or a central processing unit (CPU) that is a module/component actually operating in the slot of the motherboard, is usually inserted into the slot for testing. However, a higher manufacturing cost is required to perform testing with the actual modules/components. Furthermore, repeatedly plugging and pulling the modules/components will easily cause damage to the modules/components. When the module/component is operating at a critical point of failure, instability will occur in the test. Therefore, a test engineer needs to further analyze whether the module/component is damaged or the motherboard is abnormal, thus increasing test time and test costs.

FIG. 1 shows a test board 10 disclosed in Taiwan Patent Application No. M362410. In FIG. 1, the test board 10 is inserted into a slot 20 of a motherboard 1, so as to test whether a plurality of pins 21 of the slot 20 are normal. The test board 10 comprises a circuit board 11, a plurality of electrical plug terminals 12 and a plurality of electrical conduction parts 13. The electrical plug terminals 12 are printed on the circuit board 11 for electrically connecting to the pins 21 of the slot 20. The electrical conduction parts 13 are coupled to the corresponding electrical plug terminals 12. Therefore, when the test board 10 is inserted into the slot 20, a test signal is input to test whether soldering of the pins 21 of the slot 20 are normal. The test board 10 of FIG. 1 is only used to test whether the slot 20 is normal. However, it cannot test whether connections between the slot 20 and the other modules/components of the motherboard 1 are normal.

Therefore, a test system for testing a printed circuit board assembly (PCBA) is desirable.

BRIEF SUMMARY OF THE INVENTION

Test systems and a test method for a PCBA are provided. An embodiment of a test system is provided. The test system comprises: a printed circuit board assembly to be tested, comprising: a printed circuit board (PCB), comprising a plurality of traces and at least one test point; a central processing unit (CPU) socket disposed on the PCB, comprising a plurality of first pins, wherein the CPU socket is coupled to the test point via one of the first pins; and a memory module slot disposed on the PCB, comprising a plurality of second pins, wherein each of the second pins is coupled to the corresponding first pin of the CPU socket via the corresponding trace, wherein the CPU socket is coupled between the memory slot and the test point; a CPU interposer board inserted into the CPU socket; and a memory module interposer board inserted into the memory module slot, wherein the traces form a test loop via the CPU interposer board and the memory module interposer board. When an automatic test equipment provides a test signal to the test loop via the test point, the automatic test equipment determines whether the test loop is normal according to a reflectometry result of the test signal.

Furthermore, another embodiment of a test system is provided. The test system comprises: a printed circuit board assembly to be tested, comprising: a printed circuit board (PCB), comprising a plurality of traces and at least one test point; a central processing unit (CPU) socket disposed on the PCB, comprising a plurality of first pins, wherein the CPU socket is coupled to the test point via one of the first pins; and a plurality of memory module slots disposed on the PCB, wherein each of the memory module slots comprises a plurality of second pins and a specific pin, wherein each of the second pins is coupled to the corresponding first pin via the corresponding trace, wherein the CPU socket is coupled between the memory slots and the test point; a CPU interposer board inserted into the CPU socket; and a plurality of memory module interposer boards each inserted into the corresponding memory module slot, wherein when the specific pin of one of the memory module interposer boards receives an enable signal, the traces between the one of the memory module interposer boards and the CPU interposer board form a test loop. When an automatic test equipment provides a test signal to the test loop via the test point, the automatic test equipment determines whether the test loop is normal according to a reflectometry result of the test signal.

Furthermore, a test method for a printed circuit board assembly (PCBA) is provided. The PCBA comprises a printed circuit board (PCB), a central processing unit (CPU) socket and a memory module slot. A CPU interposer board is inserted into the CPU socket, wherein the CPU socket is disposed on the PCB and comprises a plurality of first pins, and the CPU socket is coupled to at least one test point of the PCB via one of the first pins, wherein the PCB further comprises a plurality of traces. A memory module interposer board is inserted into the memory module slot, wherein the memory module slot is disposed on the PCB and comprises a plurality of second pins, wherein each of the second pins is coupled to the corresponding first pin of the CPU socket via the corresponding trace, wherein the traces form a test loop via the CPU interposer board and the memory module interposer board. A test signal is provided to the test loop via the test point of the PCB. It is determined whether the test loop is normal according to a reflectometry result of the test signal.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
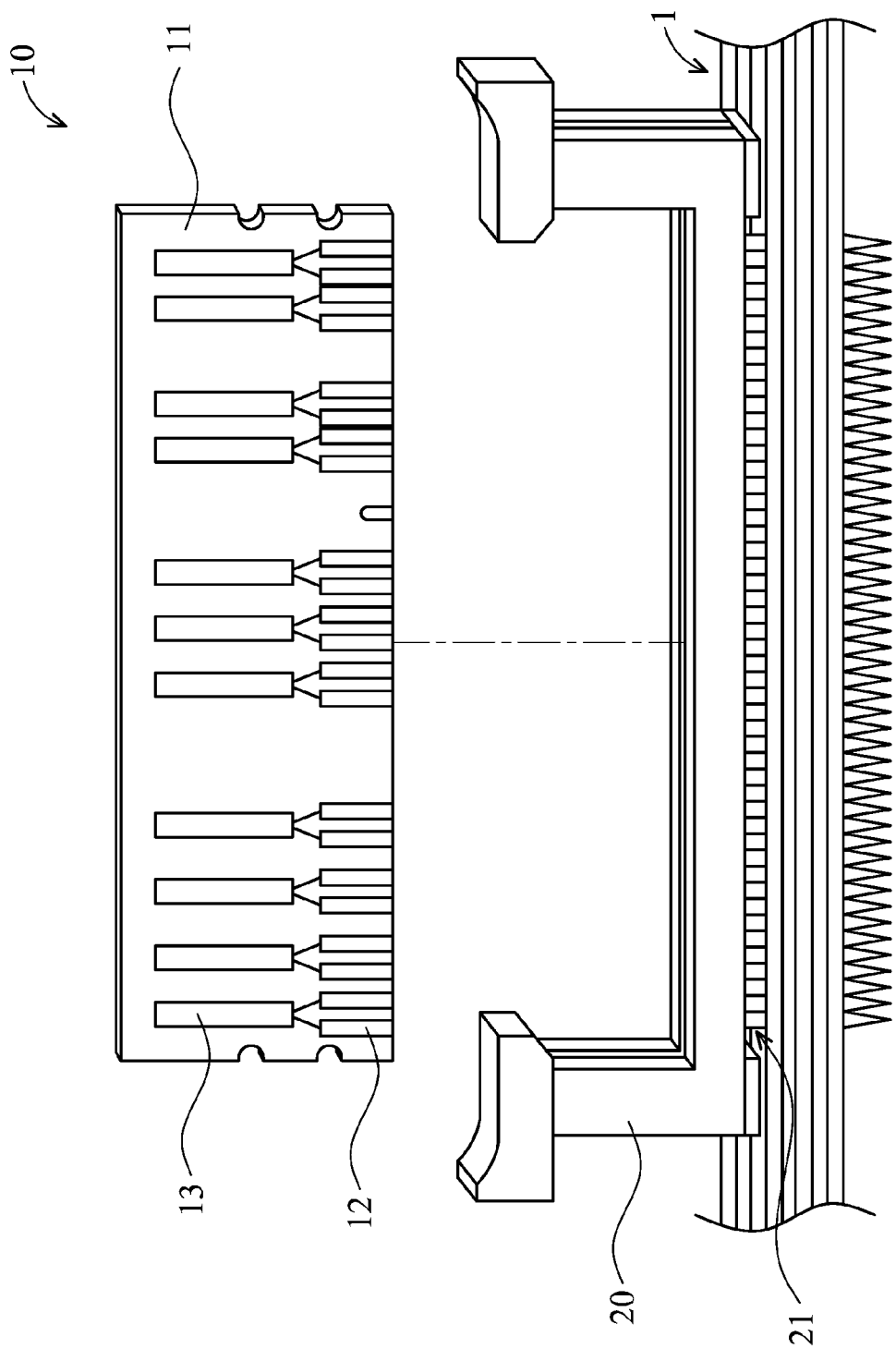
FIG. 1 shows a conventional test board.
Figure 2:
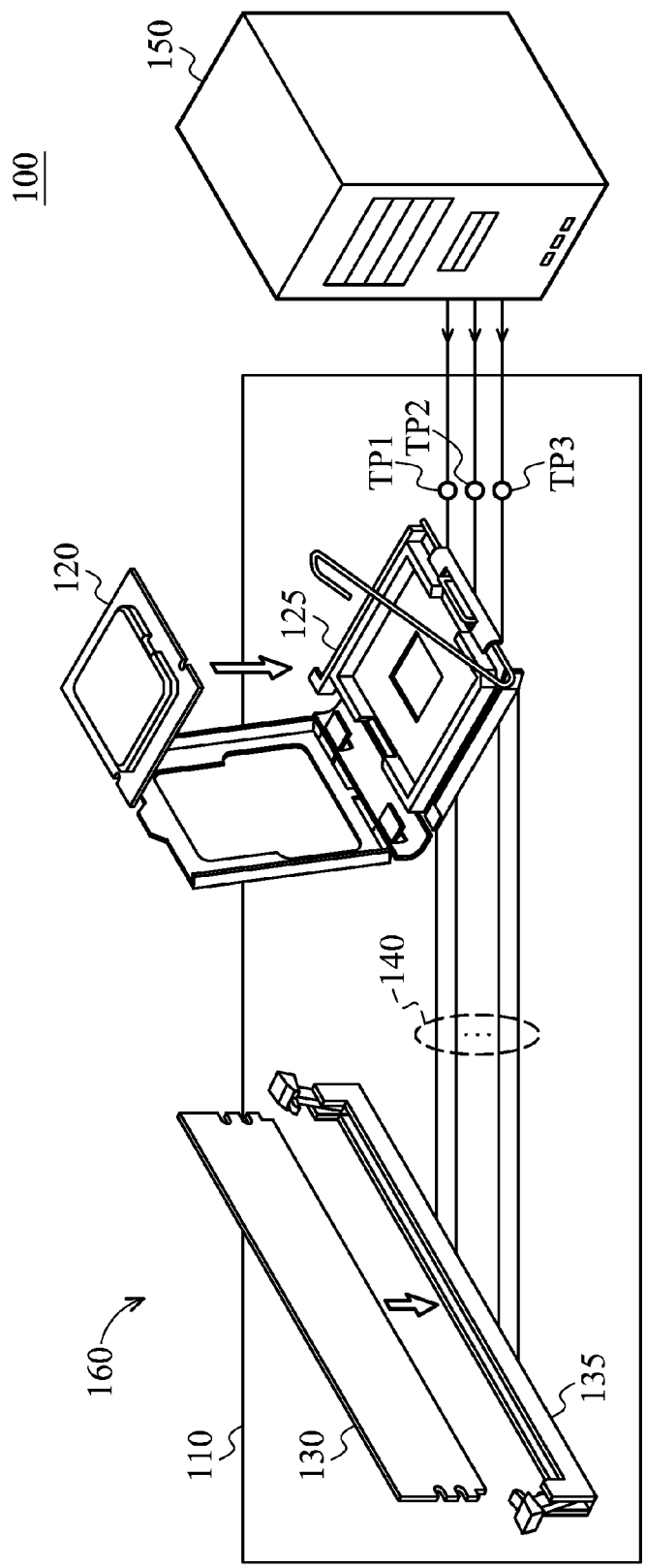
FIG. 2 shows a test system according to an embodiment of the invention.

FIG. 2 shows a test system 100 according to an embodiment of the invention. The test system 100 comprises a printed circuit board assembly (PCBA) 160 to be tested, a central processing unit (CPU) interposer board 120, a memory module interposer board 130 and automatic test equipment (ATE) 150, wherein the PCBA 160 comprises a printed circuit board (PCB) 110, a CPU socket 125 and a memory module slot 135. The CPU socket 125 and the memory module slot 135 are disposed on the PCB 110, wherein the CPU socket 125 is electrically coupled to the memory module slot 135 via a plurality of traces 140 of the PCB 110. Furthermore, the PCB 110 further comprises the test points TP1, TP2 and TP3, wherein the test points TP1, TP2 and TP3 are electrically coupled to the CPU socket 125 via the corresponding traces. Moreover, the CPU socket 125 is coupled between the memory module slot 135 and the test points TP1, TP2 and TP3. In the embodiment, the memory module slot 135 is a dual inline memory module (DIMM) slot. When the CPU interposer board 120 and the memory module interposer board 130 are inserted into the CPU socket 125 and the memory module slot 135, respectively, the ATE 150 determines whether solderability between the CPU socket 125 and the PCB 110 and solderability between the memory module slot 135 and the PCB 110 are normal via the test points TP1, TP2 and TP3. In addition, the ATE 150 further determines whether the traces 140 are a short circuit, open circuit or fault via the test points TP1, TP2 and TP3.

Figure 3:
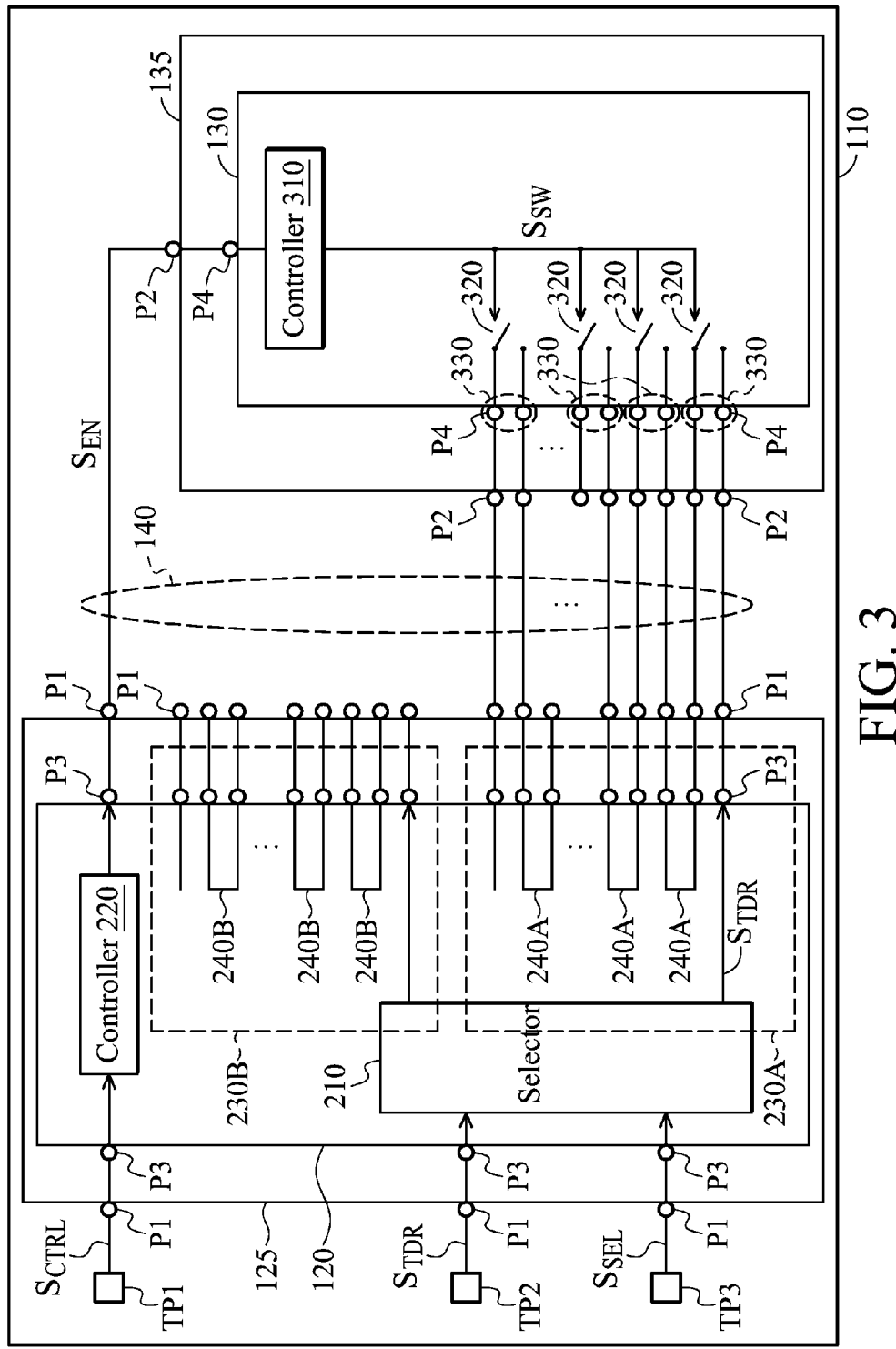
FIG. 3 shows a circuit diagram illustrating the test system of FIG. 2 according to an embodiment of the invention.

FIG. 3 shows a circuit diagram illustrating the test system 100 of FIG. 2 according to an embodiment of the invention. Referring to FIG. 2 and FIG. 3 together, the CPU socket 125 is soldered to the PCB 110 via a plurality of pins P1, and the memory module slot 135 is soldered to the PCB 110 via a plurality of pins P2, wherein each pin P1 is coupled to the corresponding pin P2 via the corresponding trace 140. Furthermore, when the CPU interposer board 120 is inserted into the CPU socket 125, a plurality of pins P3 of the CPU interposer board 120 are electrically coupled to the corresponding traces 140 via the corresponding pins P1 of the CPU socket 125. In addition, when the memory module interposer board 130 is inserted into the memory module slot 135, a plurality of pins P4 of the memory module interposer board 130 are electrically coupled to the corresponding traces 140 via the corresponding pins P2 of the memory module slot 135. The CPU interposer board 120 comprises a selector 210, a controller 220 and the loop control units 230A and 230B, wherein the loop control units 230A and 230B have the same design in circuits. In the embodiment, the traces 140 are signal wires rather than power lines.

In FIG. 3, the controller 220 receives a test signal $S_{CTRL}$ from the test point TP1, and the selector 210 receives a test signal $S_{TDR}$ from the test point TP2 and a test signal $S_{SEL}$ from the test point TP3, wherein the test signals $S_{CTRL}$, $S_{TDR}$ and $S_{SEL}$ are provided by the ATE 150 of FIG. 2. The controller 220 generates an enable signal $S_{EN}$ according to the test signal $S_{CTRL}$, and transmits the enable signal $S_{EN}$ to the memory module interposer board 130 via the trace 140, the memory module slot 135 and the specific pins P2 and P4. The selector 210 selectively provides the test signal $S_{TDR}$ to the loop control unit 230A or the loop control unit 230B according to the test signal $S_{SEL}$. In the loop control units 230A and 230B, two adjacent pins P3 are coupled to each other, so as to form a plurality of pin pairs 240A and 240B, respectively. The memory module interposer board 130 comprises a controller 310 and a plurality of switches 320. The controller 310 generates a switching signal $S_{SW}$ according to the enable signal $S_{EN}$ from the CPU interposer board 120, and provides the switching signal $S_{SW}$ to switch the switches 320. When the switching signal $S_{SW}$ controls the switches 320 to be turned on, two adjacent pins P4 are connected to each other, so as to form a plurality of pin pairs 330. Therefore, the pin pairs 240A of the loop control unit 230A of the CPU interposer board 120, the pin pairs 330 of the memory module interposer board 130 and the traces 140 form a test loop. Simultaneously, the selector 210 of the CPU interposer board 120 provides the test signal $S_{TDR}$ to the test loop according to the test signal $S_{SEL}$. Next, the ATE 150 measures a time domain reflectometry (TDR) result of the test signal $S_{TDR}$ via the test point TP2, so as to determine whether the test loop is normal. According to reflectance, the ATE 150 obtains a characteristic impedance of the test loop, and then obtains the TDR result of the test signal $S_{TDR}$. Next, if the TDR result of the test signal $S_{TDR}$ conforms to a target reflectometry result, the ATE 150 determines that the test loop is normal, i.e. the solderability between the CPU socket 125 and the PCB 110 and the solderability between the memory module slot 135 and the PCB 110 are normal, and the traces 140 of the PCB 110 are also normal. The target reflectometry result is a TDR result of a normal PCBA (e.g. a golden sample) that is measured by the ATE 150 previously. In another embodiment, the ATE 150 measures a frequency domain reflectometry (FDR) result of the test signal $S_{TDR}$ via the test point TP2, so as to determine whether the test loop is normal.

Figure 4:
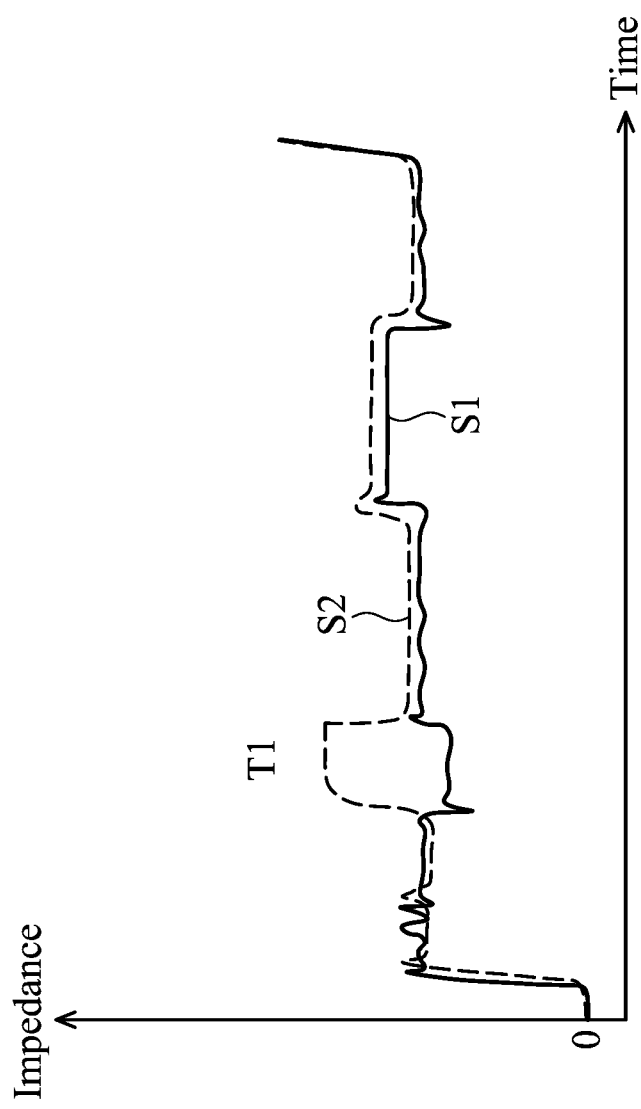
FIG. 4 shows an exemplary diagram illustrating a relationship between characteristic impedance of a test loop and time.

FIG. 4 shows an exemplary diagram illustrating a relationship between characteristic impedance of a test loop and time, wherein a curve S1 represents a target reflectometry result and a curve S2 represents a TDR result of a PCBA to be tested. During a period T1, the impedance of the curve S2 does not conform to the impedance of the curve S1, wherein the period T1 corresponds to a reflectometry result of the test signal $S_{TDR}$ which passed through the CPU socket 125 of FIG. 3. Therefore, the ATE 150 can determine that the solderability between the CPU socket 125 and the PCB 110 is abnormal.

Figure 5:
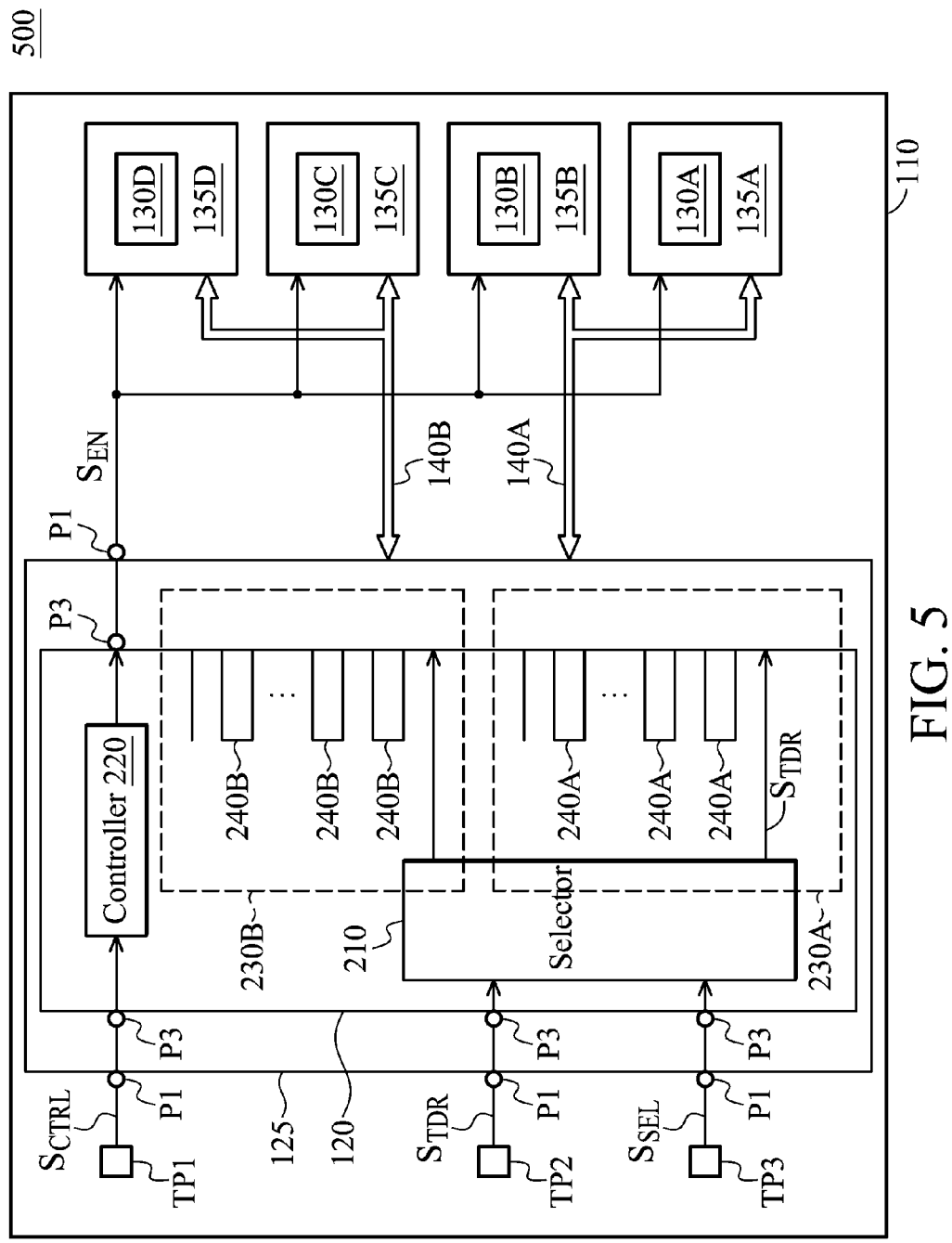
FIG. 5 shows a circuit diagram illustrating a test system according to another embodiment of the invention.

FIG. 5 shows a circuit diagram illustrating a test system 500 according to another embodiment of the invention. In the embodiment, an ATE can test a plurality of memory module slots via the test points TP1, TP2 and TP3. In FIG. 5, four memory module slots 135A, 135B, 135C and 135D are disposed on the PCB 110, wherein the memory interposer boards 130A, 130B, 130C and 130D are inserted into the memory module slots 135A, 135B, 135C and 135D, respectively. The loop control unit 230A of the CPU interposer board 120 is electrically coupled to the memory module slots 135A and 135B via the traces 140A, and the loop control unit 230B of the CPU interposer board 120 is electrically coupled to the memory module slots 135C and 135D via the traces 140B. Furthermore, the controller 220 of the CPU interposer board 120 provides the enable signal $S_{EN}$ to the memory interposer boards 130A, 130B, 130C and 130D, so as to control the switches within the memory interposer boards 130A, 130B, 130C and 130D, respectively, and then form different test loops. In FIG. 5, the amount of the memory module slots and connection manners are used as an example and does not limit the invention.

In FIG. 5, first, the ATE uses the test signal $S_{SEL}$ to control the selector 210, so as to transmit the test signal $S_{TDR}$ to the loop control unit 230A. Simultaneously, according to the test signal $S_{CTRL}$, the controller 220 of the CPU interposer board 120 provides the enable signal $S_{EN}$ to turn on the switches within the memory module interposer board 130A and to turn off the switches within the memory module interposer boards 130B, 130C and 130D. Thus, the pin pairs 240A of the loop control unit 230A of the CPU interposer board 120, the memory module interposer board 130A and the traces 140A coupled to the memory module interposer board 130A form a first test loop. Next, the ATE obtains a TDR result of the test signal $S_{TDR}$ via the test point TP2, so as to determine whether the first test loop is normal. Next, according to the test signal $S_{CTRL}$, the controller 220 provides the enable signal $S_{EN}$ to turn on the switches within the memory module interposer board 130B and to turn off the switches within the memory module interposer boards 130A, 130C and 130D. Thus, the pin pairs 240A of the loop control unit 230A of the CPU interposer board 120, the memory module interposer board 130B and the traces 140A coupled to the memory module interposer board 130B form a second test loop. Next, the ATE obtains a TDR result of the test signal $S_{TDR}$ via the test point TP2, so as to determine whether the second test loop is normal. After testing the first and second test loops successfully, the ATE uses the test signal $S_{SEL}$ to control the selector 210, so as to transmit the test signal $S_{TDR}$ to the loop control unit 230B. Furthermore, according to the test signal $S_{CTRL}$, the controller 220 of the CPU interposer board 120 provides the enable signal $S_{EN}$ to turn on the switches within the memory module interposer board 130C and to turn off the switches within the memory module interposer boards 130A, 130B and 130D. Thus, the pin pairs 240B of the loop control unit 230B of the CPU interposer board 120, the memory module interposer board 130C and the traces 140B coupled to the memory module interposer board 130C form a third test loop. Next, the ATE obtains a TDR result of the test signal $S_{TDR}$ via the test point TP2, so as to determine whether the third test loop is normal. Next, the controller 220 provides the enable signal $S_{EN}$ according to the test signal $S_{CTRL}$, to turn on the switches within the memory module interposer board 130D and to turn off the switches within the memory module interposer boards 130A, 130B and 130C. Thus, the pin pairs 240B of the loop control unit 230B of the CPU interposer board 120, the memory module interposer board 130D and the traces 140B coupled to the memory module interposer board 130D form a fourth test loop. Next, the ATE obtains a TDR result of the test signal $S_{TDR}$ via the test point TP2, so as to determine whether the fourth test loop is normal. Therefore, by providing the test signals $S_{CTRL}$, $S_{TDR}$ and $S_{SEL}$, the ATE can test the different memory module slots and the CPU socket completely.

Figure 6:
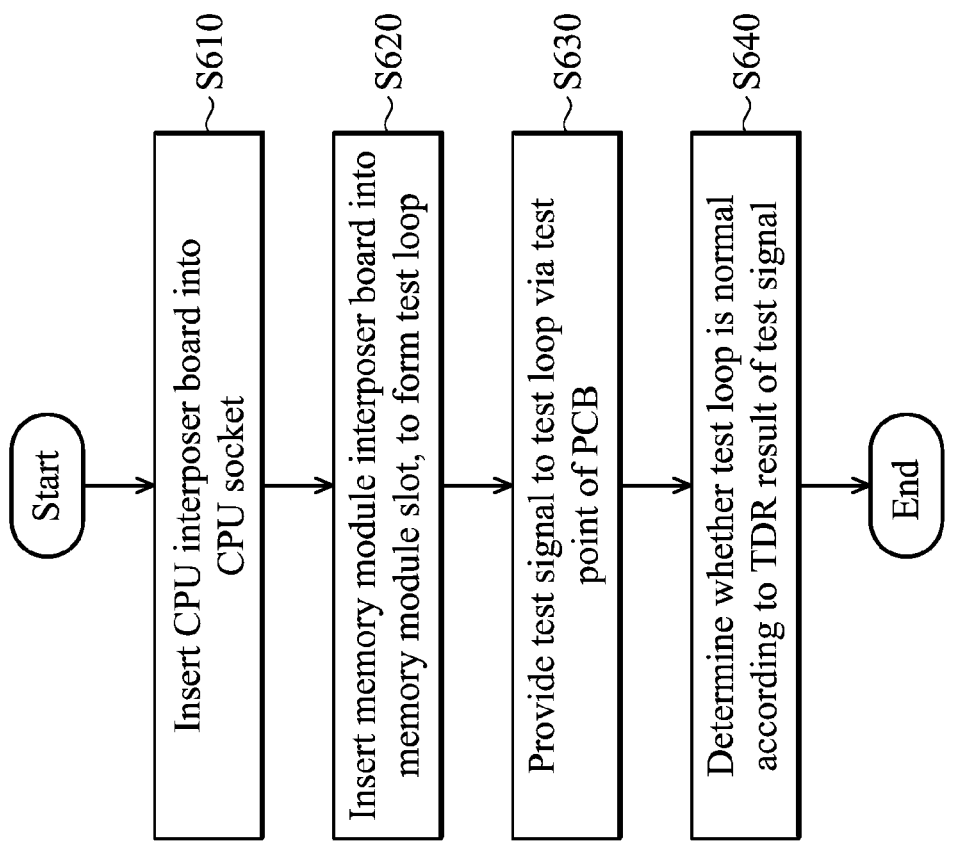
FIG. 6 shows a test method for a PCBA according to an embodiment of the invention.

FIG. 6 shows a test method for a PCBA according to an embodiment of the invention. The PCBA comprises a PCB and a CPU socket and at least one memory module slot disposed on the PCB, wherein the memory module slot is a DIMM slot. The PCB comprises a plurality of traces and at least one test point, wherein the pins of the CPU socket are coupled to the corresponding pins of the memory module slot via the corresponding traces. Furthermore, at least one pin of the CPU socket is coupled to the test point of the PCB. First, a CPU interposer board is inserted into the CPU socket (step S610). The CPU interposer board comprises a plurality of pin pairs, wherein each pin pairs comprises two pins coupled to each other, as shown in the pin pairs 240A and 240B of FIG. 3. Next, a memory module interposer board is inserted into the memory module slot (step S620), such that the traces of the PCB form a test loop via the CPU interposer board and the memory module interposer board. The memory module interposer board also comprises a plurality of pin pairs, wherein each pin pairs comprises two pins coupled to each other, as shown in the pin pairs 330 of FIG. 3. Next, an ATE provides a test signal $S_{TDR}$ to the test loop via the test point of the PCB (step S630). Next, the ATE determines whether the test loop is normal according to a TDR result of the test signal $S_{TDR}$ (step S640). For example, the ATE compares the TDR result of the test signal $S_{TDR}$ with a target reflectometry result, to determine whether the solderability between the CPU socket and the PCB and the solderability between the memory module slot and the PCB are normal and to determine whether the traces of the PCB are a short circuit, open circuit or fault.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A test system, comprising:
   a printed circuit board assembly to be tested, comprising:
   a printed circuit board (PCB), comprising a plurality of traces and at least one test point;
   a central processing unit (CPU) socket disposed on the PCB, comprising a plurality of first pins, wherein the CPU socket is coupled to the test point via one of the first pins; and
   a memory module slot disposed on the PCB, comprising a plurality of second pins, wherein each of the second pins is coupled to the corresponding first pin of the CPU socket via the corresponding trace, wherein the CPU socket is coupled between the memory slot and the test point;
   a CPU interposer board inserted into the CPU socket; and
   a memory module interposer board inserted into the memory module slot, wherein the traces form a test loop via the CPU interposer board and the memory module interposer board,
   wherein when an automatic test equipment provides a test signal to the test loop via the test point, the automatic test equipment determines whether the test loop is normal according to a reflectometry result of the test signal,
   wherein the CPU interposer board comprises a plurality of first pin pairs, wherein each of the first pin pairs comprises two third pins coupled to each other, and each of the third pins is coupled to the corresponding first pin of the CPU socket.

2. The test system as claimed in claim 1, wherein the memory module interposer board comprises a plurality of second pin pairs, wherein each of the second pin pairs comprises two fourth pins coupled to each other, and each of the fourth pins is coupled to the corresponding second pin of the memory module slot.

3. The test system as claimed in claim 2, wherein the automatic test equipment determines whether solderability between the CPU socket and the PCB is normal according to the reflectometry result.

4. The test system as claimed in claim 3, wherein the automatic test equipment further determines whether the traces are a short circuit, open circuit or fault according to the reflectometry result.

5. The test system as claimed in claim 4, wherein the automatic test equipment further determines whether solderability between the memory module slot and the PCB is normal according to the reflectometry result.

6. The test system as claimed in claim 1, wherein the memory module slot is a dual inline memory module slot.

7. The test system as claimed in claim 1, wherein the reflectometry result is a time domain reflectometry result.

8. The test system as claimed in claim 1, wherein the reflectometry result is a frequency domain reflectometry result.

9. A test system, comprising:
  a printed circuit board assembly to be tested, comprising:
    a printed circuit board (PCB), comprising a plurality of traces and at least one test point;
    a central processing unit (CPU) socket disposed on the PCB, comprising a plurality of first pins, wherein the CPU socket is coupled to the test point via one of the first pins; and
    a plurality of memory module slots disposed on the PCB, wherein each of the memory module slots comprises a plurality of second pins and a specific pin, wherein each of the second pins is coupled to the corresponding first pin via the corresponding trace, wherein the CPU socket is coupled between the memory slots and the test point;
  a CPU interposer board inserted into the CPU socket; and
  a plurality of memory module interposer boards each inserted into the corresponding memory module slot, wherein when the specific pin of one of the memory module interposer boards receives an enable signal, the traces between the one of the memory module interposer boards and the CPU interposer board form a test loop,
  wherein when an automatic test equipment provides a test signal to the test loop via the test point, the automatic test equipment determines whether the test loop is normal according to a reflectometry result of the test signal.

10. The test system as claimed in claim 9, wherein the CPU interposer board comprises a plurality of first pin pairs, wherein each of the first pin pairs comprises two third pins coupled to each other, and each of the third pins is coupled to the corresponding first pin of the CPU socket.

11. The test system as claimed in claim 10, wherein each of the memory module interposer boards comprises a plurality of second pin pairs, wherein each of the second pin pairs comprises two fourth pins coupled to each other, and each of the fourth pins is coupled to the corresponding second pin of the corresponding memory module slot.

12. The test system as claimed in claim 11, wherein the automatic test equipment determines whether solderability between the CPU socket and the PCB is normal according to the reflectometry result.

13. The test system as claimed in claim 12, wherein the automatic test equipment further determines whether the traces between the one of the memory module interposer boards and the CPU interposer board are a short circuit, open circuit or fault according to the reflectometry result.

14. The test system as claimed in claim 13, wherein the automatic test equipment further determines whether solderability between the one of the memory module slots and the PCB is normal according to the reflectometry result.

15. The test system as claimed in claim 9, wherein each of the memory module slots is a dual inline memory module slot.

16. The test system as claimed in claim 9, wherein the reflectometry result is a time domain reflectometry result.

17. The test system as claimed in claim 9, wherein the reflectometry result is a frequency domain reflectometry result.

18. A test method for a printed circuit board assembly (PCBA), wherein the PCBA comprises a printed circuit board (PCB), a central processing unit (CPU) socket and a memory module slot, the test method comprising:
  inserting a CPU interposer board into the CPU socket, wherein the CPU socket is disposed on the PCB and comprises a plurality of first pins, and the CPU socket is coupled to at least one test point of the PCB via one of the first pins, wherein the PCB further comprises a plurality of traces;
  inserting a memory module interposer board into the memory module slot, wherein the memory module slot is disposed on the PCB and comprises a plurality of second pins, wherein each of the second pins is coupled to the corresponding first pin of the CPU socket via the corresponding trace, wherein the traces form a test loop via the CPU interposer board and the memory module interposer board;
  providing a test signal to the test loop via the test point of the PCB; and
  determining whether the test loop is normal according to a reflectometry result of the test signal,
  wherein the CPU interposer board comprises a plurality of first pin pairs, wherein each of the first pin pairs comprises two third pins coupled to each other, and each of the third pins is coupled to the corresponding first pin of the CPU socket.

19. The test method as claimed in claim 18, wherein the memory module interposer board comprises a plurality of second pin pairs, wherein each of the second pin pairs comprises two fourth pins coupled to each other, and each of the fourth pins is coupled to the corresponding second pin of the corresponding memory module slot.

20. The test method as claimed in claim 19, further comprising:
  determining whether solderability between the CPU socket and the PCB is normal according to the reflectometry result;
  determining whether the traces are a short circuit, open circuit or fault according to the reflectometry result; and
  determining whether solderability between the memory module slot and the PCB is normal according to the reflectometry result.

21. The test method as claimed in claim 18, wherein the step of determining whether the test loop is normal according to the reflectometry result of the test signal further comprises:
  determining that the test loop is normal when the reflectometry result conforms to a target reflectometry result; and
  determining that the test loop is abnormal when the reflectometry result does not conform to the target reflectometry result.

22. The test method as claimed in claim 18, wherein the memory module slots is a dual inline memory module slot.

23. The test method as claimed in claim 18, wherein the reflectometry result is a time domain reflectometry result.

24. The test method as claimed in claim 18, wherein the reflectometry result is a frequency domain reflectometry result.

* * * * *